(12) United States Patent
Kuwada et al.

(10) Patent No.: US 11,499,225 B2
(45) Date of Patent: Nov. 15, 2022

(54) GAS PROCESSING APPARATUS AND GAS PROCESSING METHOD

(71) Applicant: TOKYO ELECTRON LIMITED, Tokyo (JP)

(72) Inventors: Hirotaka Kuwada, Nirasaki (JP); Takashi Kamio, Niraskai (JP); Yu Nunoshige, Nirasaki (JP); Yasushi Fujii, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 539 days.

(21) Appl. No.: 16/530,160

(22) Filed: Aug. 2, 2019

(65) Prior Publication Data

US 2020/0048765 A1 Feb. 13, 2020

(30) Foreign Application Priority Data

Aug. 10, 2018 (JP) .............................. JP2018151874

(51) Int. Cl.
*C23C 16/455* (2006.01)
*H01L 21/285* (2006.01)
*C23C 16/34* (2006.01)

(52) U.S. Cl.
CPC ........ *C23C 16/45527* (2013.01); *C23C 16/34* (2013.01); *H01L 21/28556* (2013.01)

(58) Field of Classification Search
CPC .............. C23C 16/45527; C23C 16/34; H01L 21/28556

See application file for complete search history.

(56) References Cited

U.S. PATENT DOCUMENTS

| 2010/0136216 | A1* | 6/2010 | Tsuei | H01L 31/1824 |
| | | | | 427/9 |
| 2014/0090599 | A1* | 4/2014 | Saitou | B05B 1/005 |
| | | | | 118/728 |
| 2019/0024234 | A1* | 1/2019 | Kamio | C23C 16/52 |

FOREIGN PATENT DOCUMENTS

| CN | 101339895 A | 1/2009 |
| CN | 107546152 A | 1/2018 |
| CN | 108103479 A | 6/2018 |
| JP | 7-240404 A | 9/1995 |
| JP | 2002069650 A | 3/2002 |
| JP | 2017-228726 A | 12/2017 |

(Continued)

*Primary Examiner* — Elizabeth A Burkhart
(74) *Attorney, Agent, or Firm* — Nath, Goldberg & Meyer; Jerald L. Meyer; Tanya E. Harkins

(57) ABSTRACT

There is provided a gas processing apparatus, including: a vacuum vessel; a mounting part installed in the vacuum vessel and configured to mount a substrate; an opposing part configured to face the mounting part and including first gas discharge ports configured to discharge a processing gas to the substrate; a first diffusion space configured to communicate with the first gas discharge ports; second gas discharge ports formed in a ceiling portion and configured to supply the processing gas to a central portion of the first diffusion space; a second diffusion space configured to communicate with the second gas discharge ports; a gas supply path installed at an upstream side of the second diffusion space and configured to supply the processing gas to the second diffusion space; and third gas discharge ports configured to be opened to an outer portion of the ceiling portion in an oblique direction.

8 Claims, 13 Drawing Sheets

(56) References Cited

FOREIGN PATENT DOCUMENTS

| KR | 10-2010-0124198 A | 11/2010 |
| KR | 10-2015-0108780 A | 9/2015 |
| KR | 10-2018-0001453 A | 1/2018 |

\* cited by examiner

GAS PROCESSING APPARATUS AND GAS PROCESSING METHOD

CROSS-REFERENCE TO RELATED APPLICATION

This application is based upon and claims the benefit of priority from Japanese Patent Application No. 2018-151874, filed on Aug. 10, 2018, the entire contents of which are incorporated herein by reference.

TECHNICAL FIELD

The present disclosure relates to a gas processing apparatus and a gas processing method.

BACKGROUND

A gas processing, such as film formation by atomic layer deposition (ALD) or chemical vapor deposition (CVD), is often carried out on a semiconductor wafer (hereinafter, referred to as a "wafer"), which is a substrate. During the gas processing, a gas is supplied to the wafer, for example, in a shower shape. Patent Document 1 describes a film forming apparatus that performs chemical vapor deposition (CVD) by supplying a gas to a mounting table, on which a wafer is mounted. In the film forming apparatus, a susceptor for supporting the wafer and a shower head provided above the susceptor are installed. The shower head includes a first porous plate (face plate) facing the wafer and having a plurality of holes formed therein, and a second porous plate (blocker plate) installed above the first porous plate so as to vertically partition a gas diffusion space constituting the shower head.

PRIOR ART DOCUMENT

Patent Document

Patent Document 1: Japanese Patent Laid-Open Publication No. 2002-69650

SUMMARY

The present disclosure provides some embodiments of a technique capable of performing gas processing with high uniformity in the plane of a substrate.

According to one embodiment of the present disclosure, there is provided a gas processing apparatus, including: a vacuum vessel configured to form a vacuum atmosphere in the vacuum vessel; a mounting part installed in the vacuum vessel and configured to mount a substrate; an opposing part configured to face the mounting part and including first gas discharge ports configured to discharge a processing gas in a shower shape to the substrate to perform a gas processing; a first diffusion space of the processing gas formed above the opposing part and configured to communicate with the first gas discharge ports; second gas discharge ports formed in a ceiling portion which faces an upper portion of the first diffusion space, vertically opened in the ceiling portion, and configured to supply the processing gas in a shower shape to a central portion of the first diffusion space; a second diffusion space of the processing gas formed above the ceiling portion and configured to communicate with the second gas discharge ports; a gas supply path installed at an upstream side of the second diffusion space and configured to supply the processing gas to the second diffusion space; and third gas discharge ports, each of the third gas discharge ports configured to: be opened to an outer portion of the ceiling portion which is outside a region in the ceiling portion to which the second gas discharge ports are opened, be opened in an oblique direction having a larger slope with respect to a vertical axis than a slope of the second gas discharge ports with respect to the vertical axis, communicate with the second diffusion space in a row along a circumference of the first diffusion space, and radially discharge the processing gas from a central side of the first diffusion space to a peripheral side of the first diffusion space.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
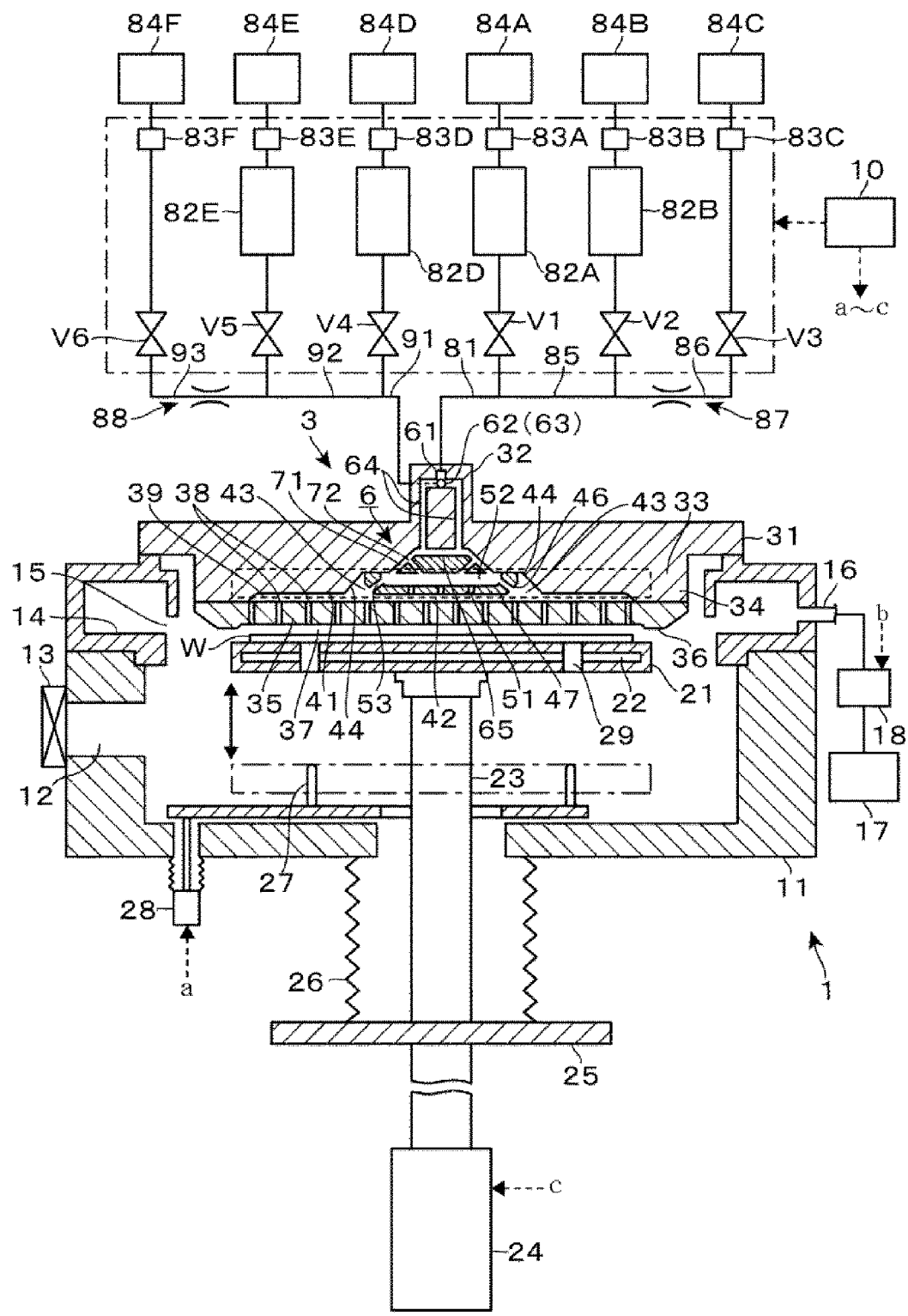
FIG. 1 is a longitudinal sectional side view of a film forming apparatus according to one embodiment of the present disclosure.

A film forming apparatus 1 according to one embodiment of a gas processing apparatus of the present disclosure will be described with reference to a longitudinal sectional side view of FIG. 1. The film forming apparatus 1 includes a flat circular process vessel 11. In the process vessel 11, a vacuum atmosphere is formed and a wafer W, which is a circular substrate having a diameter of, for example, 300 mm, is stored. The film forming apparatus 1 performs ALD by alternately and repeatedly supplying a titanium tetrachloride (TiCl$_4$) gas as a raw material gas and an ammonia (NH$_3$) gas as a reaction gas to the wafer W to form a titanium nitride (TiN) film. A nitrogen (N$_2$) gas as an inert gas is supplied as a purge gas between a time period for supplying the TiCl$_4$ gas as a first processing gas and a time period for supplying the NH$_3$ gas as a second processing gas. By supplying the purge gas, the internal atmosphere of the process vessel 11 is changed from a TiCl$_4$ gas atmosphere or an NH$_3$ gas atmosphere to an N$_2$ gas atmosphere. In addition, the N$_2$ gas is continuously supplied into the process vessel 11 as a carrier gas for introducing the TiCl$_4$ gas and the NH$_3$ gas into the process vessel 11 during a film forming process by ALD.

A wafer loading/unloading port 12 and a gate valve 13 for opening and closing the loading/unloading port 12 are installed on a sidewall of the process vessel 11. An exhaust duct 14, which forms a portion of the sidewall of the process vessel 11 and is formed by annularly curving a duct having a rectangular longitudinal section, is installed on an upper portion of the loading/unloading port 12. A slit-like opening 15 extending along a circumferential direction of the exhaust duct 14 is formed on an inner peripheral surface of the exhaust duct 14 to form an exhaust port of the process vessel 11.

Furthermore, one end of an exhaust pipe 16 is connected to the exhaust duct 14. The other end of the exhaust pipe 16 is connected to an exhaust mechanism 17 configured by a vacuum pump. A pressure regulating mechanism 18 configured by, for example, a pressure regulating valve, is interposed in the exhaust pipe 16. A degree of opening of the pressure regulating valve is adjusted based on control signals output from a controller 10 to be described later such that the internal pressure of the process vessel 11 is adjusted to have a desired vacuum pressure.

In the drawing, reference numeral 21 denotes a circular horizontal mounting table installed in the process vessel 11 for mounting the wafer W. The wafer W is mounted so that the center of the wafer W is aligned with the center of the mounting table. A heater 22 is embedded in the mounting table 21 forming a mounting part. The heater 22 heats the wafer W to, for example, 400 degrees C. to 700 degrees C. An upper end of a support member 23, which penetrates the bottom of the process vessel 11 and extends vertically, is connected to the center portion of the lower surface side of the mounting table 21, and a lower end of the support member 23 is connected to an elevating mechanism 24. The mounting table 21 is moved up and down between a lower position (a transfer position) indicated by a chain line in FIG. 1 and an upper position (a processing position) indicated by a solid line in FIG. 1, by the elevating mechanism 24. The lower position is a position for transferring the wafer W into and out of a transfer mechanism of the wafer W entering the process vessel 11 from the loading/unloading port 12. The upper position is a position for processing the wafer W.

In the drawing, reference numeral 25 denotes a flange which is installed in the support member 23 and is installed below the bottom of the process vessel 11. In the drawing, reference numeral 26 denotes an expandable bellows with an upper end connected to the bottom of the process vessel 11 and a lower end connected to the flange 25 so as to ensure an airtight seal of the process vessel 11. In the drawing, reference numeral 27 denotes three support pins (only two support pins are shown in the drawing), and reference numeral 28 denotes an elevating mechanism for elevating and lowering the support pins 27. When the mounting table 21 is located at the transfer position, the support pins 27 protrude and retract on the upper surface of the mounting table 21 by their elevating and lowering via through holes 29 formed in the mounting table 21 so that the wafer W is transferred between the mounting table 21 and the transfer mechanism.

A gas supply path forming part 3 is installed on an upper side of the exhaust duct 14 so as to close the inside of the process vessel 11 from the upper side. The gas supply path forming part 3 includes a body section 31 and a gas introduction part 32. The body section 31 is configured as a flat circular block, and a peripheral portion of the body section 31 is installed along the exhaust duct 14 to be supported on the exhaust duct 14. Although a cooling mechanism for adjusting the temperature of the gas supply path forming part 3 is installed on an upper side of the body section 31, illustration thereof is omitted here. The gas introduction part 32 is formed such that a portion along the radial direction of the upper surface of the body section 31 rises upward.

The body section 31 will be described in more detail. A central lower portion of the body section 31 protrudes in the process vessel 11 toward the mounting table 21 to form a circular ceiling forming part 33 constituting the ceiling of the process vessel 11. A peripheral portion of the ceiling forming part 33 further extends downward to form an annular support projection 34, and a disc-shaped shower plate 35 is horizontally supported at the lower end of the support projection 34. A partitioned space surrounded by the support projection 34 and the upper surface of the shower plate 35 is a first diffusion space 39 for laterally diffusing each gas supplied from an upper shower head 42 to be described later, and is formed in a flat circular shape.

The shower plate 35 forms an opposing part configured to face the surface of the mounting table 21. Furthermore, the upper surface of the shower plate 35 defining the first diffusion space 39 is horizontally flat. In addition, a peripheral portion of the shower plate 35 is formed along the support projection 34. A peripheral lower portion of the shower plate 35 protrudes downward to form an annular processing space forming projection 36, and approaches the peripheral portion of the mounting table 21 at the upper position described above. A space located between the shower plate 35 and the mounting table 21 at the upper position and surrounded by the processing space forming projection 36 is formed as a processing space 37 for processing the wafer W. In a region of the shower plate 35 surrounded by the processing space forming projection 36, a plurality of first gas discharge ports 38 is dispersed in the region and are formed to penetrate the plate in a thickness direction of the plate, i.e., in a vertical direction. Therefore, each of the first gas discharge ports 38 communicates with the processing space 37 and the first diffusion space 39.

In a lower surface of the ceiling forming part 33 forming the first diffusion space 39, a recess is formed at the center portion of the region surrounded by the support projection 34, and the outside of the recess forms a horizontal flat opposing surface 41 facing the shower plate 35. The recess has a circular shape in a plan view. A diameter of the recess increases toward a bottom of the recess. The circular upper shower head 42 is installed to protrude downward from the bottom of the recess. Therefore, an annular groove is formed along the periphery of the first diffusion space 39 so as to surround the upper shower head 42, and is referred to as an annular groove 43. The annular groove 43 becomes narrow toward its upper side. Furthermore, the lower portion of the ceiling forming part 33 forming the opposing surface 41, the annular groove 43, and the upper shower head 42 face the upper portion of the first diffusion space 39, and form a ceiling portion 49 forming the upper side of the first diffusion space 39 (see FIG. 2).

Figure 3:
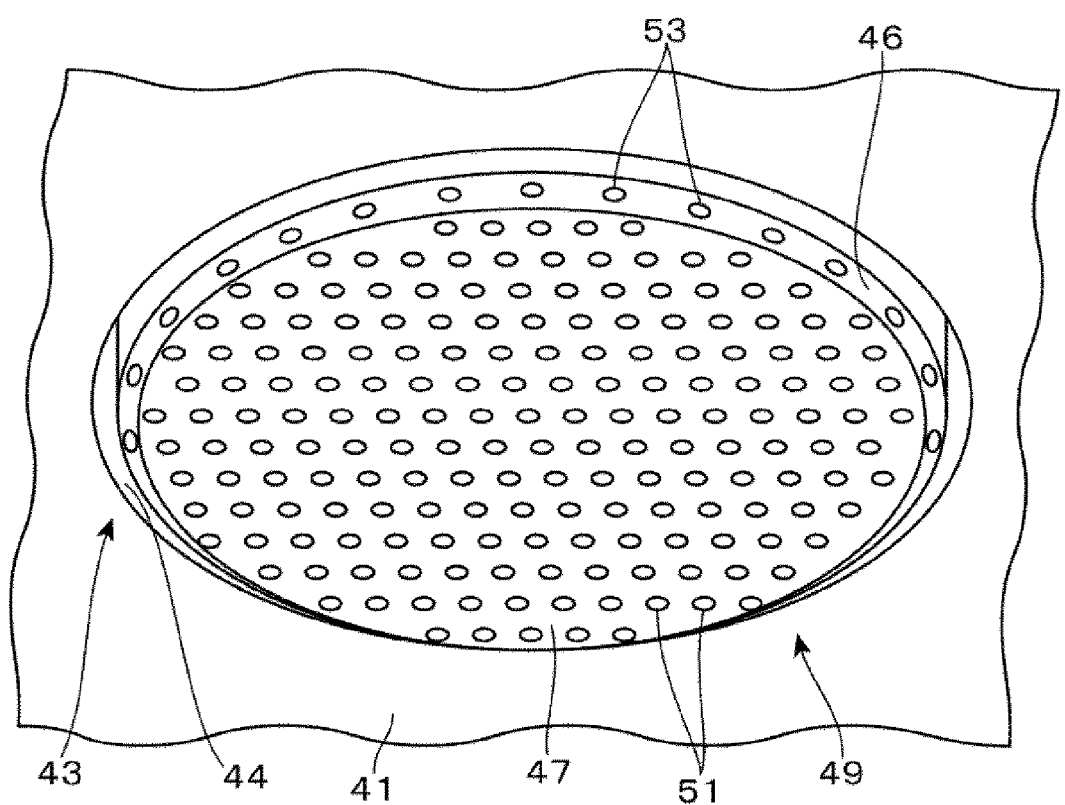
FIG. 3 is a bottom perspective view of the upper shower head.
Figure 4:
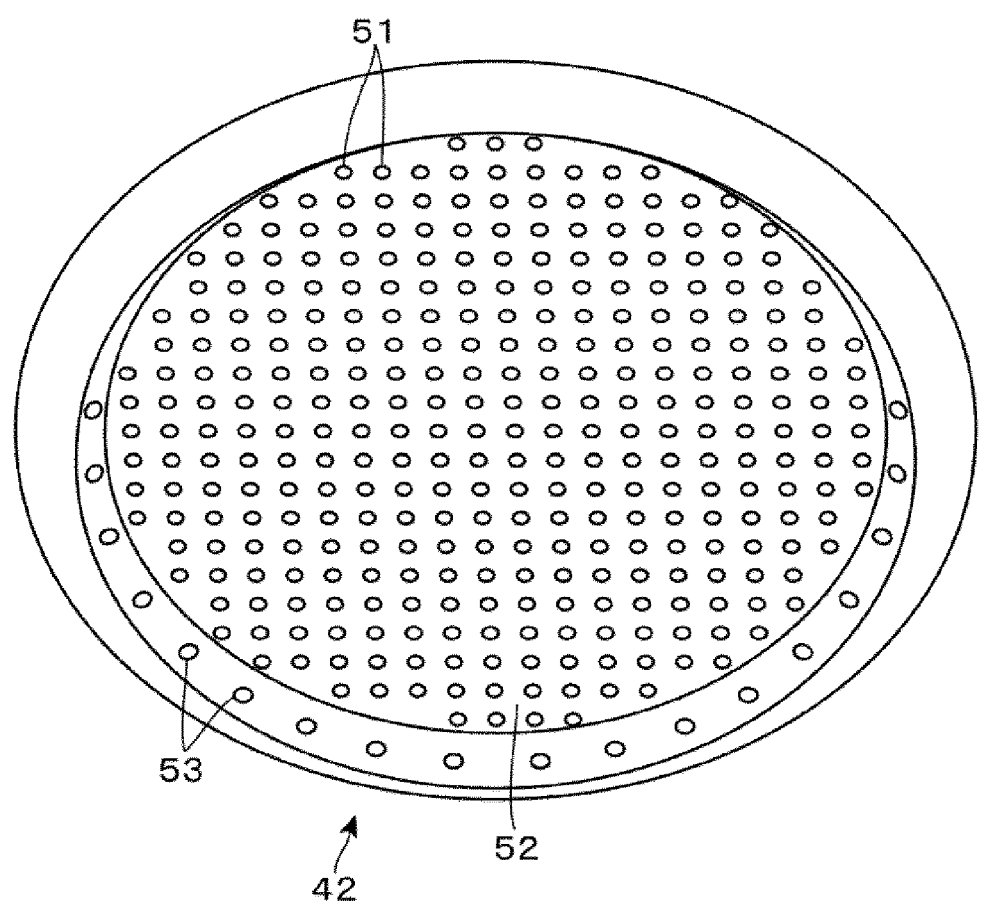
FIG. 4 is a top perspective view of the upper shower head.

Hereinafter, the upper shower head 42 will be described with reference to FIG. 2 which is a longitudinal sectional side view of the upper shower head 42, FIG. 3 which is a bottom perspective view, FIG. 4 which is a top perspective view, and FIG. 5 which is a transverse plan view thereof. An outer peripheral side surface of the annular groove 43 is formed as an inclined surface 44 which descends from the central side of the first diffusion space 39 toward the peripheral side thereof. An angle θ1 (see FIG. 2) formed between the inclined surface 44 and the horizontal surface is, for example, 20° to 50°, more specifically, for example, 30°. The inclined surface 44 guides a gas discharged into the annular groove 43 from third gas discharge ports 53 of the upper shower head 42, which will be described later, to the peripheral portion of the first diffusion space 39. This serves to prevent the gas from staying in the first diffusion space 39.

A diameter of a lower portion of the upper shower head 42 decreases toward the lower end of the upper shower head 42 so that the side surface of the lower portion of the upper shower head 42 is formed as an inclined surface 46 forming an inner peripheral side surface of the annular groove 43. Furthermore, the lower surface of the upper shower head 42 is continuous with the inclined surface 46 and is formed as a horizontal opposing surface 47 facing the upper surface of the shower plate 35. In the opposing surface 47, a plurality of second gas discharge ports 51 is dispersed in the surface, and is respectively opened in the vertical direction. In order to prevent a large amount of gas from being supplied locally to the wafer W, the second gas discharge ports 51 are formed so as not to overlap with the first gas discharge ports 38 of the shower plate 35. In addition, the fact that the first gas discharge ports 38 and the second gas discharge ports 51 are vertically formed means that they are vertically formed in terms of design. For example, vertical formation includes, for example, even the case where the discharge ports 38 and 51 are inclined by several degrees to the vertical axis due to manufacturing errors and assembling errors of the device.

A circular shallow recess is formed in a central upper portion of the upper shower head 42, and the upper portion of the recess is blocked by the ceiling forming part 33. Thus, the inside of the recess is formed as a circular flat second diffusion space 52 partitioned from the periphery. Furthermore, the centers of the upper shower head 42 and the second diffusion space 52 are respectively aligned with the centers of the first diffusion space 39 and the mounting table 21, in a plan view, so as to uniformly supply a gas to the wafer W. Each gas supplied to the upper shower head 42 is laterally diffused in the second diffusion space 52. The respective second gas discharge ports 51 are connected to the bottom of the second diffusion space 52.

In addition, in the inclined surface 46 of the upper shower head 42, a plurality of third gas discharge ports 53 is installed in a row along the circumference of the first diffusion space 39. Each of the third gas discharge ports 53 is opened at the same height, and intervals between adjacent third gas discharge ports 53 are equal to each other. Furthermore, each of the third gas discharge ports 53 is formed to be oblique with respect to the vertical direction while approaching the upward direction toward the center of the upper shower head 42, and is connected to the side portion of the second diffusion space 52. For example, an angle θ2 formed between the opening direction of the third gas discharge port 53 and the horizontal plane is 30 to 90° (see FIG. 2), more specifically, for example, 45°. The third gas discharge ports 53 are radially formed to penetrate the upper shower head 42 in a plan view, and radially discharge a gas from the central portion to the peripheral portion of the first diffusion space 39, as illustrated in FIG. 5.

Figure 2:
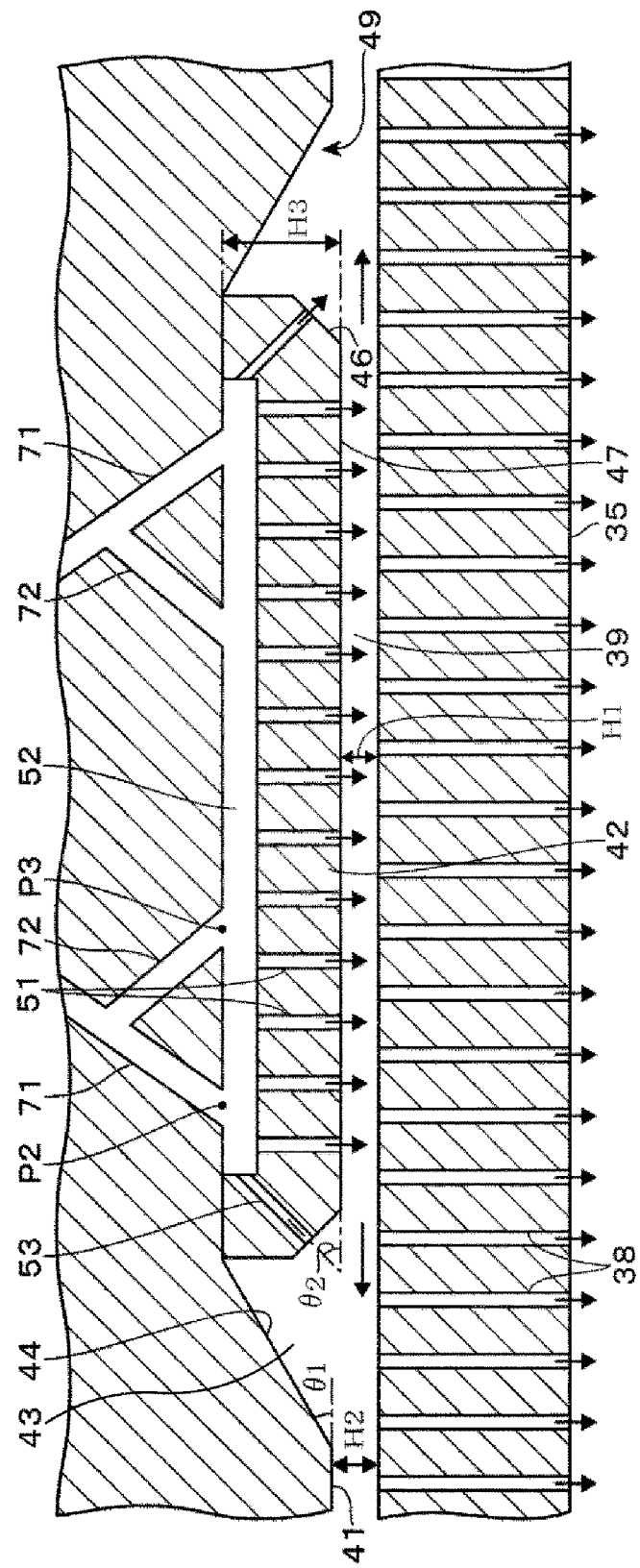
FIG. 2 is a longitudinal sectional side view of a shower plate and an upper shower head constituting the film forming apparatus.

Meanwhile, in FIG. 2, a height between the upper surface of the shower plate 35 and the opposing surface 47 of the upper shower head 42 is indicated as H1. Furthermore, a height between the upper surface of the shower plate 35 and the opposing surface 41 outside the annular groove 43 is indicated as H2. In order to prevent the gas from staying in the first diffusion space 39, for example, the heights H1 and H2 are the same. In addition, when the volume of the first diffusion space 39 is small, it is possible to shorten the length of one cycle of ALD to be described later by reducing the time required for purging a $TiCl_4$ gas and an $NH_3$ gas in the first diffusion space 39. Therefore, it is preferable that the heights H1 and H2 be, for example, 8 mm or less, and a depth H3 of the annular groove 43 be, for example, 12 mm or less.

Figure 5:
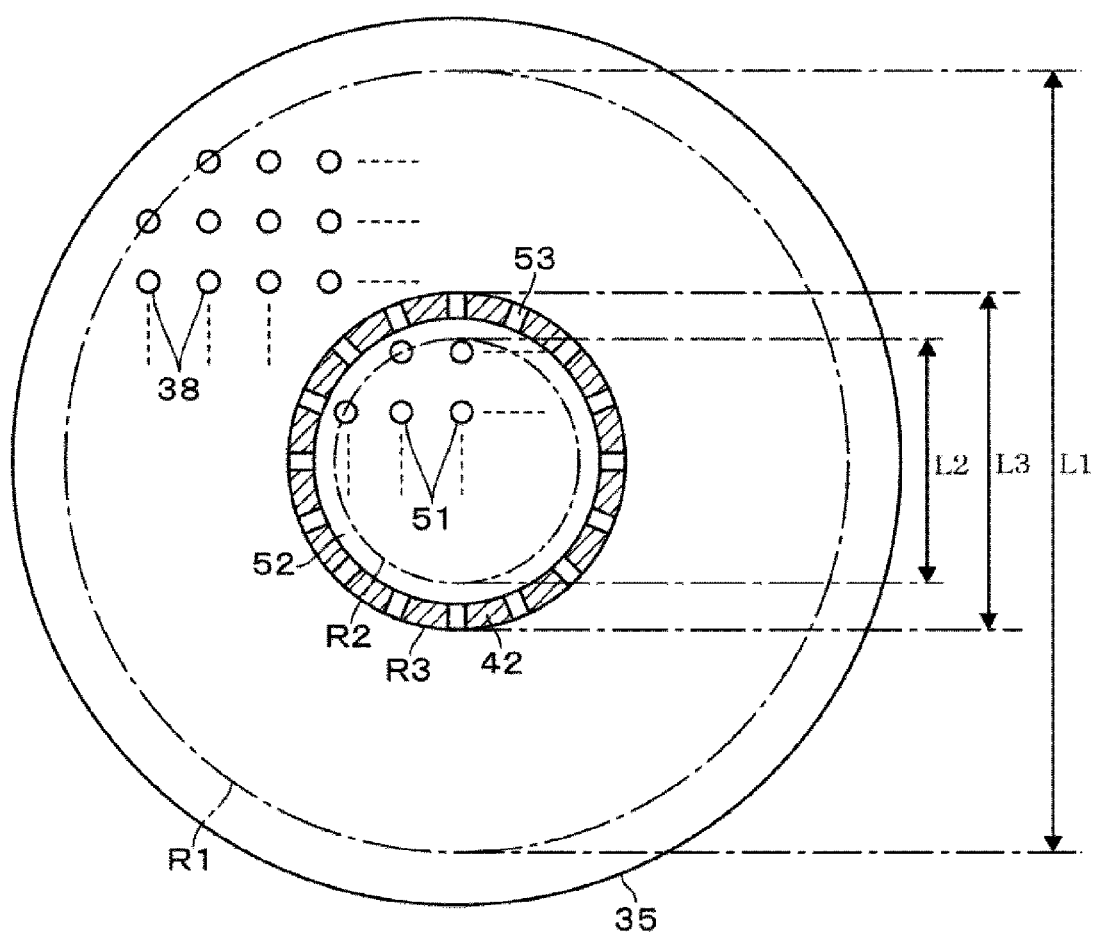
FIG. 5 is a transverse plan view of the upper shower head.

Furthermore, reference symbol R1 shown in FIG. 5 denotes a virtual circle connecting the centers of the respective first gas discharge ports 38 located closest to the periphery of the shower plate 35. Reference symbol R2 denotes a virtual circle connecting the centers of the second gas discharge ports 51 located closest to the periphery of the opposing surface 47 of the upper shower head 42. Reference symbol R3 indicates a circle connecting the centers of the third gas discharge ports 53, but indicates that the circle R3 overlaps with the outer edge of the upper shower head 42 in FIG. 5. That is, the circles R1, R2, and R3 indicate formation regions of the first gas discharge ports 38, the second gas discharge ports 51, and the third gas discharge ports 53, respectively. The centers of the circles R1, R2, and R3 are aligned with one another, and the sizes of their diameters are as follows: circle R1>circle R3>circle R2. Therefore, a region in which the second gas discharge ports 51 or the third gas discharge ports 53 are distributed is smaller than a region in which the first gas discharge ports 38 are distributed. The diameters of the circle R1, the circle R2, and the circle R3 are respectively indicated as diameters L1, L2, and L3. L1 is substantially equal to the diameter of the wafer W, for example, 300 mm. L2/L1 is, for example, 0.3 to 0.4, and L3/L1 is, for example, 0.35 to 0.45.

Returning to FIG. 1, a gas supply path 6 installed in the gas supply path forming part 3 for supplying each gas to the second diffusion space 52 of the upper shower head 42 will be described with reference to FIGS. 6 and 7. The gas supply path 6 is configured by a first dedicated flow path 61, a second dedicated flow path 62, a merged flow path 63, two branch paths 64, a third diffusion space 65, eight first connection flow paths 71, and eight second connection flow paths 72. The first dedicated flow path 61, the second dedicated flow path 62, the merged flow path 63, and upper portions of the branch paths 64 are formed in, for example, the gas introduction part 32. Lower portions of the branch paths 64, the third diffusion space 65, the first connection flow paths 71, and the second connection flow paths 72 are formed in, for example, the body section 31.

The first dedicated flow path 61 and the second dedicated flow path 62 respectively extend in a horizontal direction. The first dedicated flow path 61 and the second dedicated flow path 62 are partitioned from each other.

A raw material gas, a carrier gas of the raw material gas, and a purge gas are supplied to an upstream side of the first dedicated flow path 61, A reaction gas, a carrier gas of the reaction gas, and a purge gas are supplied to an upstream side of the second dedicated flow path 62. Therefore, the first dedicated flow path 61 is a flow path dedicated to the raw material gas between the raw material gas and the reaction gas, and the second dedicated flow path 62 is a flow path dedicated to the reaction gas between the raw material gas and the reaction gas. The first dedicated flow path 61 is located above the second dedicated flow path 62, and a downstream side of the first dedicated flow path 61 is bent downward and connected to the second dedicated flow path 62. Thus, the downstream sides of the first dedicated flow path 61 and the second dedicated flow path 62 merge with each other and form the merged flow path 63.

A downstream side of the merged flow path 63 horizontally extends along an extension direction of the second dedicated flow path 62, and then branches into left and right directions along a direction perpendicular to the extension direction to form the two branch paths 64. Upstream sides of the respective branch paths 64 extend horizontally. Downstream sides of the respective branch paths 64 are bent vertically downward, and each of the downstream sides of the respective branch paths 64 is connected to different positions in the flat third diffusion space 65. By branching the downstream side of the merged flow path 63 and connecting the branch paths 64 to the third diffusion space 65 in this manner, the gas is distributed in the third diffusion space 65 with high uniformity, and further, uniformity of concentration of each gas in the second diffusion space 52 is enhanced. Furthermore, lengths of the respective branch paths 64 are equal to each other.

The third diffusion space 65 is configured by a cross flow path 66 formed by one linear introduction path and another linear introduction path, which cross each other in a plan view, four branch paths 67, and eight branch ends 68. Downstream ends of the branch paths 64 are respectively connected to one end and the other end of one linear flow path constituting the cross flow path 66. Lengths from the center of the cross flow path 66 to the downstream end of each branch path 64 are equal to each other. The center of the cross flow path 66 is located above the center portion of the second diffusion space 52. Each end of the other linear flow path constituting the cross flow path 66 branches into left and right directions, when viewed in the extension direction of the other linear flow path, to form the branch paths 67.

Upstream sides of the branch paths 67 extend along one linear introduction path forming the cross flow path 66. Furthermore, the downstream sides of the branch paths 67 are bent with respect to the upstream sides thereof, and extend away from the center of the cross flow path 66. The downstream ends of the branch paths 67 branch into the left and right directions, when viewed in the extension direction of the flow path at the downstream sides of the branch paths 67, and form the branch ends 68. Each of the branch ends 68 has a wide width in a plan view, as if each of the branch ends 68 extends toward outside of the center of the cross flow path 66. Upstream ends of the eight first connection flow paths 71, which are linear flow paths, are connected to the lower portions of the eight branch ends 68, respectively. Lengths from the center of the cross flow path 66 to the respective first connection paths 71 are equal to each other.

Downstream sides of the eight first connection flow paths 71 extend obliquely downward, and radially extend in a plan view. Downstream ends of the first connection flow paths 71 are connected to the upper peripheral portion of the second diffusion space 52. Each of the first connecting flow paths 71 has the same length. Furthermore, the second connection flow paths 72, which are linear flow paths, extend and protrude obliquely downward from the center in the longitudinal direction of each of the first connection flow paths 71, and extend toward the central portion of the second diffusion space 52 in a plan view. Each of the second connection flow paths 72 also has the same length. In addition, downstream ends of the second connection flow paths 72 are connected to the second diffusion space 52 while having equally spaced intervals in a circumferential direction, and are connected at positions in the second diffusion space 52 that are closer to the center of the second diffusion space 52 than positions in the second diffusion space 52 where the first connection flow paths 71 are connected. Furthermore, the first connection flow paths 71 and the second connection flow paths 72 are obliquely connected to the second diffusion space 52 which is formed horizontally. The first connection flow paths 71 and the second connection flow paths 72 are configured as inclined flow paths.

Figure 6:
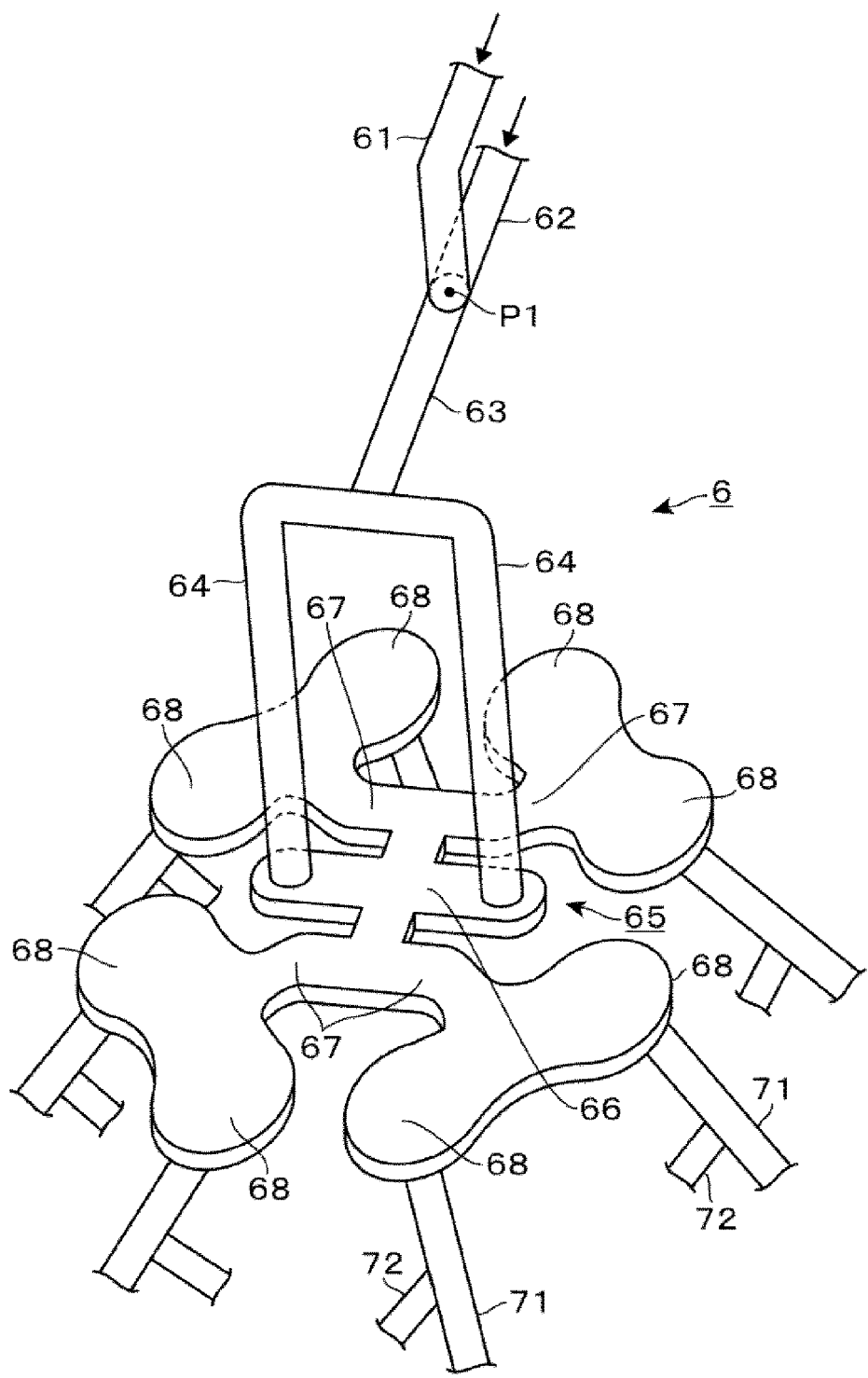
FIG. 6 is a perspective view of a flow path installed in the film forming apparatus.
Figure 7:
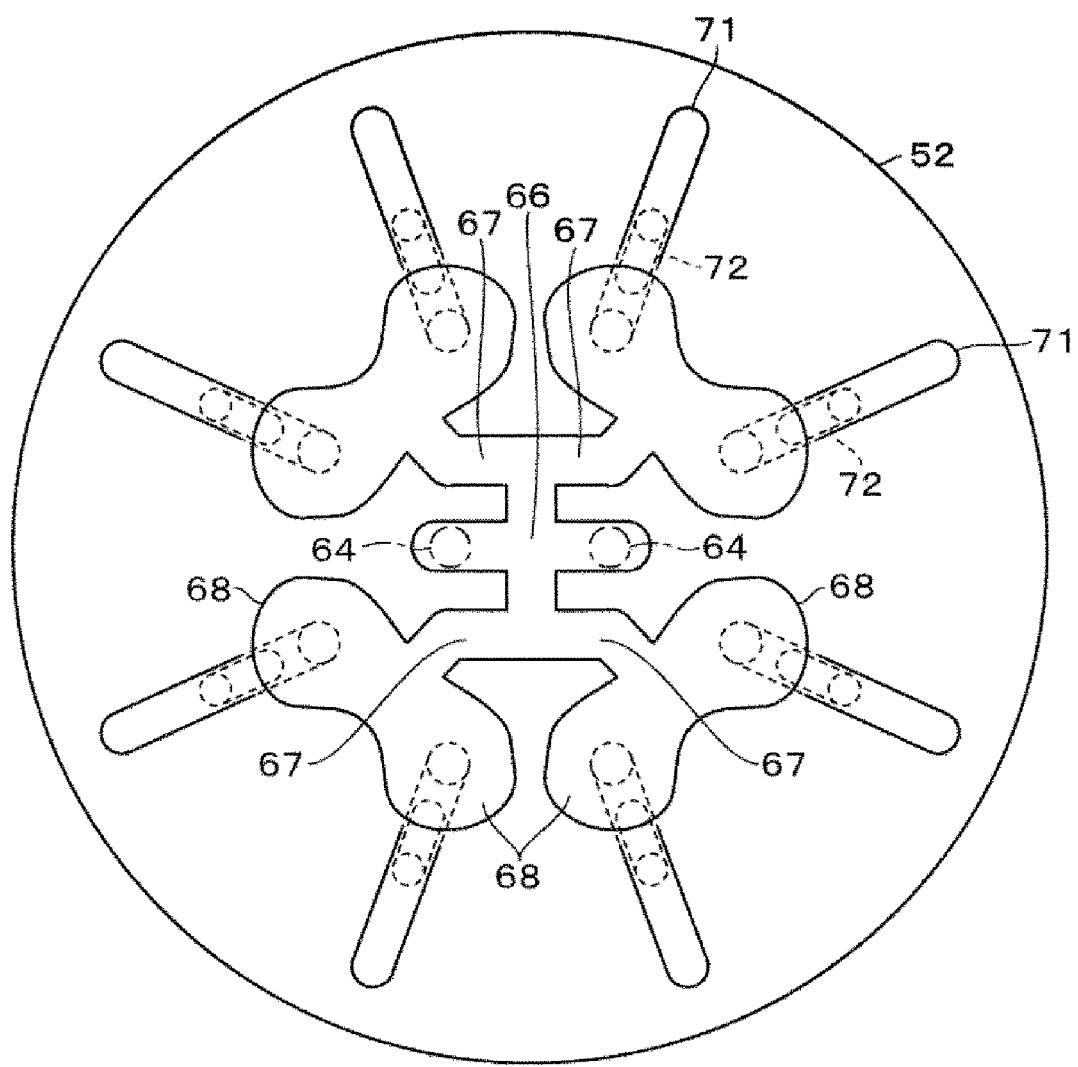
FIG. 7 is a plan view of the flow path.

An upstream end of the merged flow path 63, i.e., the downstream ends of the first dedicated flow path 61 and the second dedicated flow path 62 where the first dedicated flow path 61 and the second dedicated flow path 62 merge with each other, is indicated as a point P1 in FIG. 6. Furthermore, in FIG. 2, the downstream end of the first connection flow path 71 is indicated as a point P2, and the downstream end of the second connection flow path 72 is indicated as a point P3. The points P2 and P3 are also the upper ends of the second diffusion space 52. Lengths of the flow paths from the point P1 to each point P2 are equal. Lengths of the flow paths from the point P1 to each point P3 are equal. Furthermore, the length of the flow path from the point P1 to the point P2 and the length of the flow path from the point P1 to the point P3 are equal to each other.

Meanwhile, the fact that the lengths of the flow paths are equal to each other means that the flow paths are equal in terms of design of the apparatus. That is, even if the lengths of the flow paths are different due to errors in assembling the members constituting the apparatus or processing accuracy of the members, if the lengths of the flow paths are designed to be equal to each other, the lengths of the flow paths are considered to be equal. In addition, regarding the respective flow paths from the point P1 to each of the points P2 and P3, flow path widths at positions in which the distances from the point P1 are equal to each other may be the same. Alternatively, the concentration distribution of gas in the second diffusion space 52 may be adjusted by setting the flow path widths to be slightly different.

Returning to FIG. 1, the description will be continued. Downstream ends of pipes 81 and 91 are respectively connected to the upstream ends of the first dedicated flow path 61 and the second dedicated flow path 62, which are formed in the gas supply path forming part 3. An upstream end of the pipe 81 is connected to a supply source 84A of a $TiCl_4$ gas, which is a processing gas, via a valve V1, a gas storage tank 82A, and a flow rate adjustment part 83A in this order. The flow rate adjustment part 83A is configured by a mass flow controller, and adjusts the flow rate of the $TiCl_4$ gas supplied from the gas supply source 84A to the downstream side of the flow rate adjustment part 83A. Furthermore, other respective flow rate adjustment parts 83B to 83F to be described later are also configured in the same manner as the flow rate adjustment part 83A, and adjust the flow rate of the gas supplied to the downstream side of the pipes.

The gas storage tank 82A, which forms a gas storage part, temporarily stores the $TiCl_4$ gas supplied from the gas supply source 84A before supplying it into the process vessel 11. In this manner, the $TiCl_4$ gas is stored, and the internal pressure of the gas storage tank 82A is raised to a predetermined pressure, and thereafter, the TiCl$_4$ gas is supplied from the gas storage tank 82A to the gas supply path forming part 3. The supply of and cessation in supplying the TiCl$_4$ gas with respect to the gas supply path forming part 3 from the gas storage tank 82A are performed by opening and closing the valve V1. By temporarily storing the TiCl$_4$ gas in the gas storage tank 82A in this manner, the TiCl$_4$ gas can be supplied to the process vessel 11 at a relatively high flow rate. Similar to the gas storage tank 82A, each gas supplied from the gas supply source at the upstream side of the pipe is also temporarily stored in each of gas storage tanks 82B, 82D, and 82E forming the gas storage part to be described later. Furthermore, the supply of and cessation in supplying the gas with respect to the gas supply path forming part 3 from the respective gas storage tanks 82B, 82D, and 82E are performed by opening and closing respective valves V2, V4, and V5 installed at the downstream sides of the respective gas storage tanks 82B, 82D, and 82E.

A downstream end of a pipe 85 is connected to the pipe 81 at the downstream side of the valve V1. An upstream end of the pipe 85 is connected to a supply source 84B of N$_2$ gas via the valve V2, the gas storage tank 82B, and the flow rate adjustment part 83B in this order. In addition, a downstream end of a pipe 86 is connected to the pipe 85 at the downstream side of the valve V2. An upstream end of the pipe 86 is connected to a supply source 84C of N$_2$ gas via a valve V3 and a flow rate adjustment part 83C in this order.

The pipe 91 will be described. An upstream end of the pipe 91 is connected to a supply source 84D of NH$_3$ gas via the valve V4, the gas storage tank 82D, and the flow rate adjustment part 83D in this order. A downstream end of a pipe 92 is connected to the pipe 91 at the downstream side of the valve V4. An upstream end of the pipe 92 is connected to a supply source 84E of N$_2$ gas via the valve V5, the gas storage tank 82E, and the flow rate adjustment part 83E in this order. In addition, a downstream end of a pipe 93 is connected to the pipe 92 at the downstream side of the valve V5. The upstream end of the pipe 93 is connected to a supply source 84F of N$_2$ gas via a valve V6 and the flow rate adjustment part 83F in this order.

An orifice 87 is formed on the downstream side of the valve V3 in the pipe 86, and an orifice 88 is formed on the downstream side of the valve V6 in the pipe 93. The orifices 87 and 88 are installed to form narrowed flow paths in the respective pipes 86 and 93 in order to prevent each gas supplied at a relatively large flow rate by each gas storage tank from flowing toward the valves V3 and V6.

Meanwhile, the N$_2$ gas supplied from the N$_2$ gas supply sources 84B and 84E is supplied into the process vessel 11 to perform the aforementioned purge operation. The N$_2$ gas supplied from the N$_2$ gas supply sources 84C and 84F is a carrier gas for carrying the TiCl$_4$ gas and the NH$_3$ gas. Since the carrier gas is continuously supplied into the process vessel 11 during the processing of the wafer W as described above, it is also supplied into the process vessel 11 when performing the purge operation. Therefore, the time period during which the carrier gas is supplied into the process vessel 11 overlaps with the time period during which the N$_2$ gas from the gas supply sources 84B and 84E is supplied into the process vessel 11 to perform the purge operation, such that the carrier gas will also be used for purge. However, for convenience of description, the gas supplied from the N$_2$ gas supply sources 84B and 84E will be described as the purge gas, and the gas supplied from the N$_2$ gas supply sources 84C and 84F will be described as the carrier gas.

The film forming apparatus 1 further includes a controller 10. The controller 10 is configured as a computer, and includes a program, a memory, and a CPU. The program has a group of steps organized so that a series of operations to be described later in the film forming apparatus 1 can be performed, and the controller 10 controls operations of the respective parts of the film forming apparatus 1 by outputting control signals to the respective parts by the program. Specifically, respective operations such as the opening/closing of the respective valves V1 to V6, the adjustment of the gas flow rate by the flow rate adjustment parts 83A to 83F, the adjustment of the internal pressure of the process vessel 11 by the pressure regulating mechanism 18, the adjustment of the temperature of the wafer W by the heater 22, and the like are controlled by the control signals. The program is stored in a storage medium such as a compact disc, a hard disk, or a DVD, and is installed in the controller 10.

Figure 8:
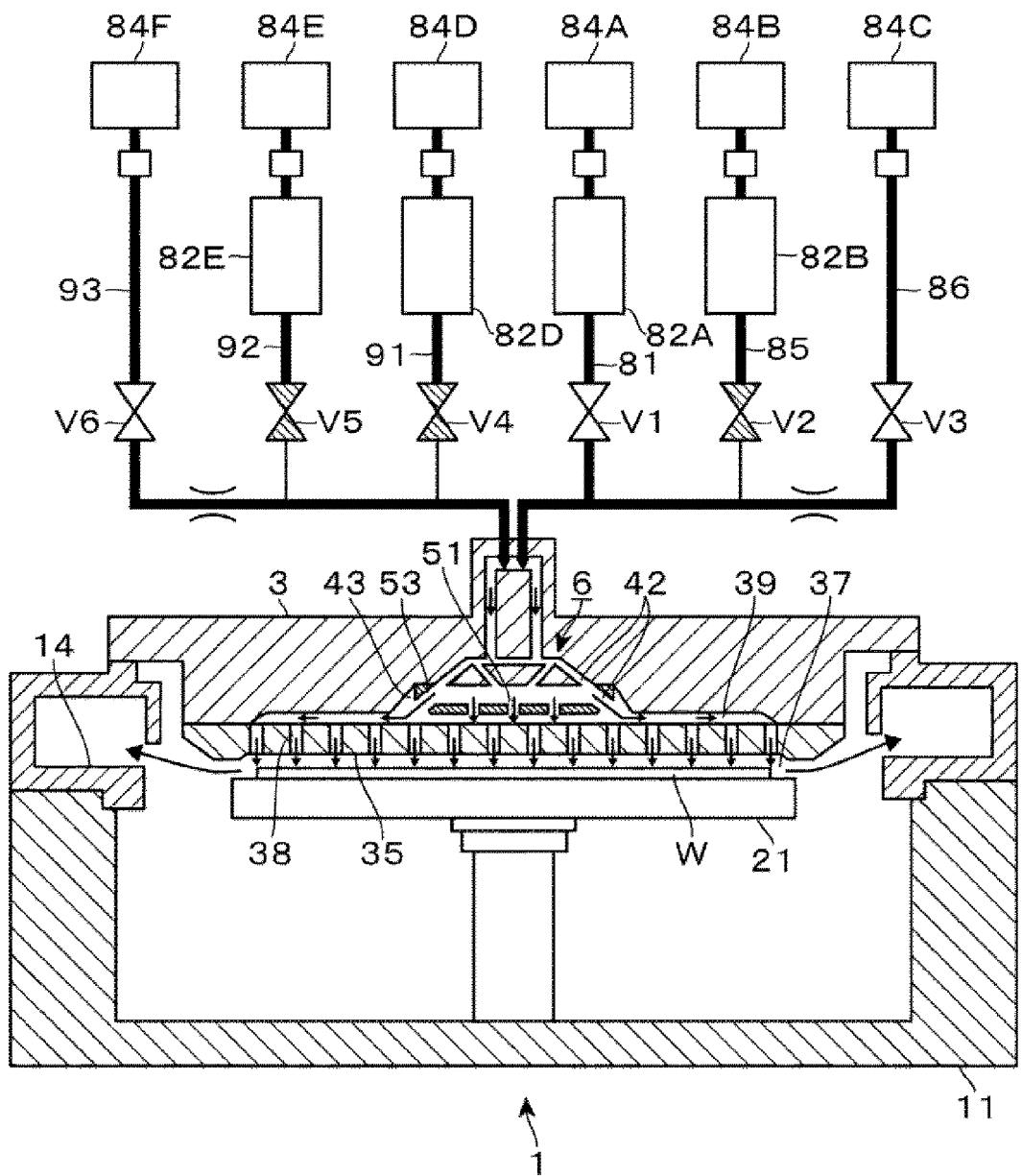
FIG. 8 is a schematic view illustrating a process performed by the film forming apparatus.
Figure 9:
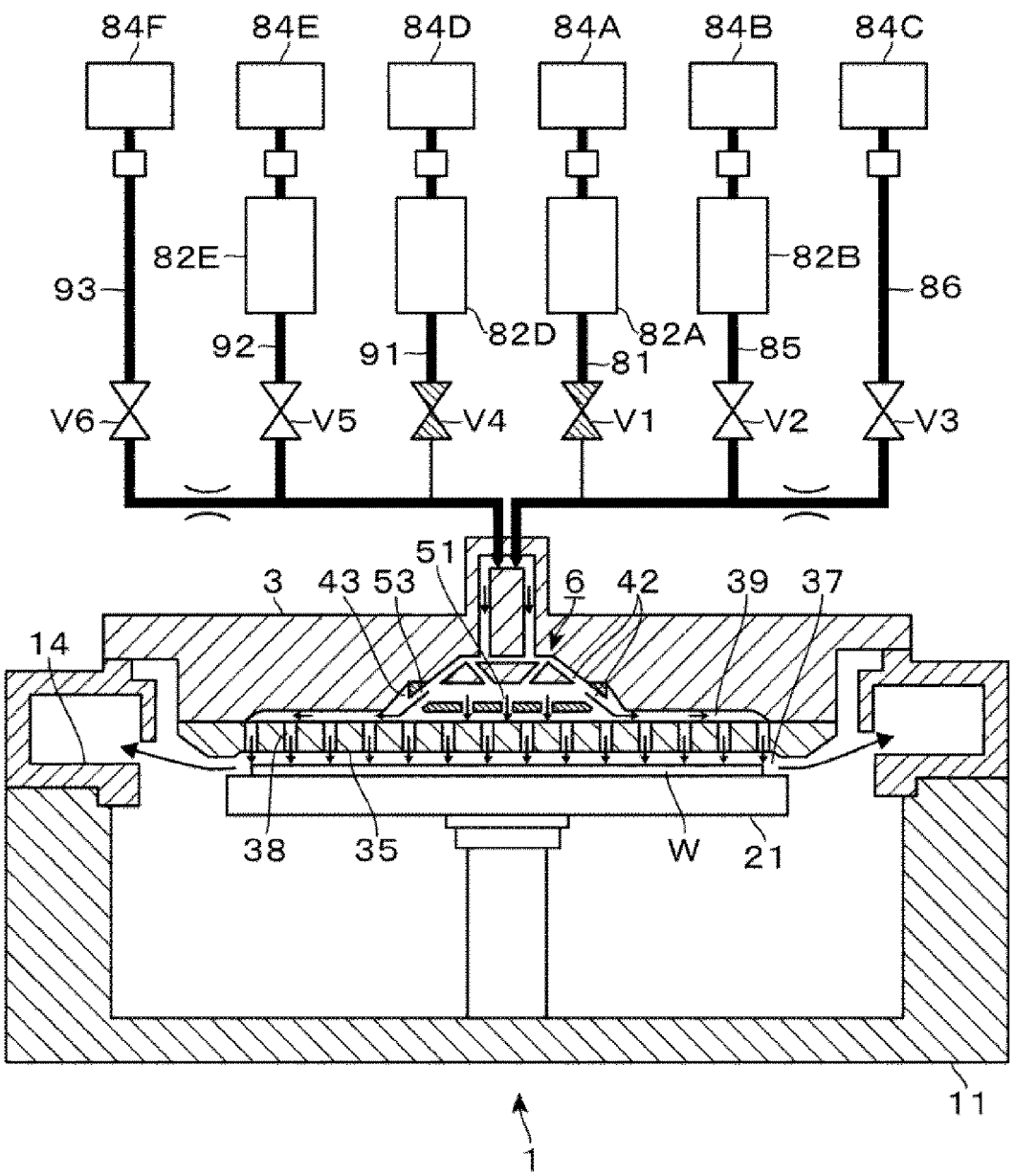
FIG. 9 is a schematic view illustrating a process performed by the film forming apparatus.
Figure 10:
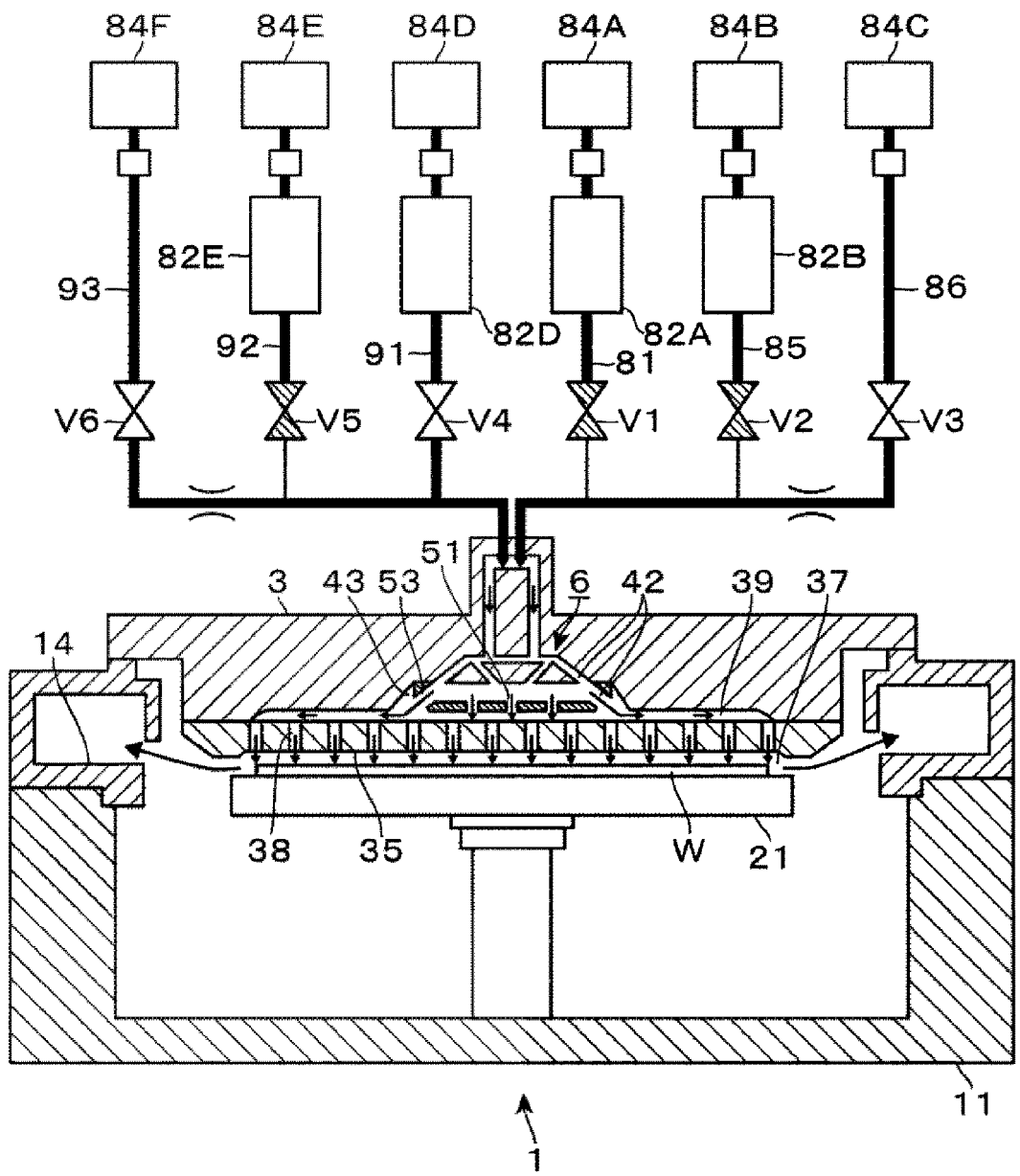
FIG. 10 is a schematic view illustrating a process performed by the film forming apparatus.
Figure 11:
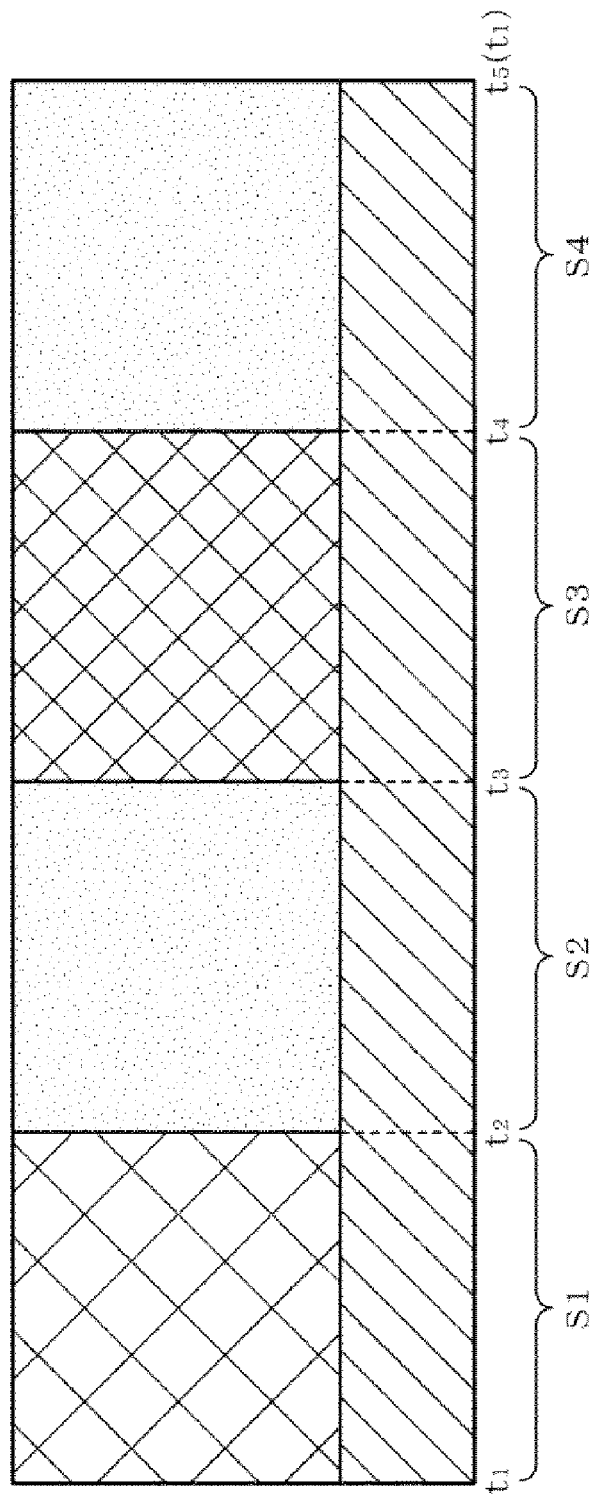
FIG. 11 is a timing chart of a process performed by the film forming apparatus.

Next, the film forming process performed by the film forming apparatus 1 will be described with reference to FIGS. 8 to 10 illustrating the opening/closing state of each valve and the state of gas flow in each pipe. In FIGS. 8 to 10, closed valves V are hatched to distinguish them from opened valves V. Furthermore, in the pipes 81, 85, 86, and 91 to 93, a portion in which a gas is flowing downstream is indicated thicker than a portion in which a gas is not flowing. In addition, FIG. 11 which is a timing chart illustrating time periods for supplying each gas will also be referred to as appropriate. In this timing chart, hatch is indicated in the supply period of carrier gas, and dots are indicated in the supply period of purge gas. Moreover, a network pattern is indicated in each of the supply period of TiCl$_4$ gas and the supply period of NH$_3$ gas, and the network pattern indicating the supply period of TiCl$_4$ gas is more coarse than the network pattern indicating the supply period of NH$_3$ gas.

First, in a state in which the valves V1 to V6 are closed, the wafer W is transferred into the process vessel 11 by the transfer mechanism and mounted on the mounting table 21 at the transfer position. After the transfer mechanism is withdrawn from the interior of the process vessel 11, the gate valve 13 is closed. The wafer W is heated to the aforementioned temperature by the heater 22 of the mounting table 21, and the mounting table 21 is raised to the processing position such that the processing space 37 is formed. On the other hand, the interior of the process vessel 11 attains a predetermined vacuum pressure by exhaust from the exhaust duct 14.

Then, the valves V3 and V6 are opened to supply a carrier gas (N$_2$ gas) from the respective N$_2$ gas supply sources 84C and 84F to the gas supply path 6. On the other hand, a TiCl$_4$ gas and an NH$_3$ gas are supplied respectively from the gas supply source 84A and the gas supply source 84D to the pipes 81 and 91. Since the valves V1 and V4 are closed, these TiCl$_4$ gas and NH$_3$ gas are respectively stored in the gas storage tanks 82A and 82D, and the internal pressures of the gas storage tanks 82A and 82D are raised. Thereafter, the valve V1 is opened (time t1 in the chart), and the TiCl$_4$ gas stored in the gas storage tank 82A is supplied to the upper shower head 42 via the gas supply path 6. Then, the TiCl$_4$ gas is discharged vertically downward from the second gas discharge ports 51 of the upper shower head 42, supplied to the center of the first diffusion space 39, and discharged into the annular groove 43 obliquely downward from the third gas discharge ports 53. The TiCl$_4$ gas discharged into the annular groove 43 flows along the inclined surface 44 of the annular groove 43, so that it is supplied to the outside of the annular groove 43 without remaining in the annular groove

43. Furthermore, since the upper surface of the shower plate 35 and the opposing surface 41 of the gas supply path forming part 3, which form the upper portion and the lower portion of the first diffusion space 39 respectively, are flat, the TiCl$_4$ gas, which has flowed to the outside of the annular groove 43, is rapidly directed to the peripheral portion of the first diffusion space 39 without the flow being blocked.

By supplying the TiCl$_4$ gas to every portion of the first diffusion space 39 as described above, the TiCl$_4$ gas is distributed in every portion of the first diffusion space 39 with high uniformity of concentration within a short time from the start of supply of the TiCl$_4$ gas. Then, the TiCl$_4$ gas is supplied from the first gas discharge port 38 of the shower plate 35 to the wafer W, and the TiCl$_4$ gas is adsorbed with high uniformity in the plane of the wafer W. In parallel to the supply of the TiCl$_4$ gas to the wafer W, a purge gas (N$_2$ gas) is supplied from each of the gas supply sources 84B and 84E to each of the pipes 85 and 92. Since the valves V2 and V5 are closed, the purge gas is stored in the gas storage tanks 82B and 82E, and the interior pressures of the gas storage tanks 82B and 82E are raised (FIG. 8 and step S1).

Thereafter, the valve V1 is closed and the valves V2 and V5 are opened (time t2). Thus, the supply of the TiCl$_4$ gas into the process vessel 11 is stopped, and the purge gas stored in each of the gas storage tanks 82B and 82E is supplied to the gas supply path 6. Similar to the TiCl$_4$ gas, the purge gas is discharged from the second gas discharge ports 51 and the third gas discharge ports 53 of the upper shower head 42 into the first diffusion space 39. Therefore, similar to the TiCl$_4$ gas, the purge gas is quickly diffused in the first diffusion space 39 with high uniformity, and is discharged from the shower plate 35.

As a result, the TiCl$_4$ gas remaining within the processing space 37 without being adsorbed to the wafer W is simultaneously or substantially simultaneously removed from the upper side of every portion in the plane of the wafer W, and the adsorption of the TiCl$_4$ gas to the wafer W is stopped. The TiCl$_4$ gas is purged to the exhaust duct 14 and removed from the interior of the process vessel 11. While the purge operation is performed in this manner, the TiCl$_4$ gas supplied from the gas supply source 84A to the pipe 81 is stored in the gas storage tank 82A as the valve V1 is closed, and the internal pressure of the gas storage tank 82A is raised (FIG. 9, step S2).

Subsequently, the valves V2 and V5 are closed and the valve V4 is opened (time t3). Thus, the supply of the purge gas to the gas supply path 6 is stopped, and the NH$_3$ gas stored in the gas storage tank 82D is supplied to the gas supply path 6 and is discharged from the second gas discharge ports 51 and the third gas discharge ports 53 of the upper shower head 42 into the first diffusion space 39. Similar to the TiCl$_4$ gas and the purge gas, the NH$_3$ gas is also distributed so as to increase the uniformity of concentration in every portion of the first diffusion space 39, and is supplied from the shower plate 35 to the processing space 37. Thus, the NH$_3$ gas is supplied to every portion in the plane of the wafer W with high uniformity. As a result, the nitriding reaction of the TiCl$_4$ gas adsorbed with high uniformity in the plane of the wafer W proceeds to form a thin layer of TiN as a reaction product. On the other hand, when the valves V2 and V5 are closed, the purge gas supplied from each of the gas supply sources 84B and 84E to each of the pipes 85 and 92 is stored in each of the gas storage tanks 82B and 82E, and the internal pressures of the gas storage tanks 82B and 82E are raised (FIG. 10, step S3).

Thereafter, the valve V4 is closed and the valves V2 and V5 are opened, in which each valve is opened and closed in the same manner as step S2 described with reference to FIG. 9 (time t4). According to such an opening/closing state, the supply of the NH$_3$ gas into the process vessel 11 is stopped, and the purge gas stored in each of the gas storage tanks 82B and 82E is supplied to the gas supply path 6, similar to step S2. Then, the purge gas is discharged from the upper shower head 42 to the first diffusion space 39 and further discharged from the shower plate 35. By the supply of the purge gas, the unreacted NH$_3$ gas remaining within the processing space 37 is simultaneously or substantially simultaneously removed from the upper side of every portion in the plane of the wafer W and the nitriding reaction is stopped so that the thickness of the thin layer of TiN in every portion in the plane of the wafer W is uniform. The NH$_3$ gas removed from the upper side of the wafer W is purged to the exhaust duct 14 and removed from the interior of the process vessel 11. In this manner, the purge operation is performed, while the valve V4 is closed, whereby the NH$_3$ gas supplied from the gas supply source 84D to the pipe 91 is stored in the gas storage tank 82D and the internal pressure of the gas storage tank 82D is raised (step S4).

After a lapse of a predetermined time from time t4, the valves V2 and V5 are closed and the valve V1 is opened (time t5), and thus, the supply of the purge gas into process vessel 11 is stopped, and the TiCl$_4$ gas stored in gas storage tank 82A is supplied to the gas supply path 6. That is, step S1 is performed again. Therefore, the time t5 when the purge operation is completed is also the time t1 when the supply of the TiCl$_4$ gas starts. After step S1 is performed, steps S2 to S4 are performed, and thereafter, steps S1 to S4 are performed again. That is, when steps S1 to S4 are set as one cycle, this cycle is repeatedly performed to deposit a thin layer of TiN on the surface of the wafer W to form a TiN film. Then, when a predetermined number of cycles are executed, the wafer W is unloaded from the process vessel 11 in a reverse order of loading the wafer W into the process vessel 11.

In the film forming apparatus 1, the upper shower head 42, which supplies the gas from the central upper side of the first diffusion space 39 formed above the shower plate 35, is installed. The upper shower head 42 includes the second gas discharge ports 51 and the third gas discharge ports 53. The second gas discharge ports 51 are vertically opened. The third gas discharge ports 53 are opened obliquely to the outer portion of the opposing surface 47 on which the second gas discharge ports 51 are formed. The third gas discharge ports 53 are installed in a row along the circumference of the first diffusion space 39. The gas is supplied to the center portion of the first diffusion space 39 by the second gas discharge ports 51. On the other hand, a sufficient amount of gas is also quickly supplied to the peripheral portion of the first diffusion space 39 by the third gas discharge ports 53. Therefore, each gas can be distributed in the first diffusion space 39 with high uniformity. As a result, since the gas can be supplied from the shower plate 35 to every portion in the plane of the wafer W with high uniformity concentration, the TiN film can be formed to have a film thickness with high uniformity in the plane of the wafer W. Furthermore, the third gas discharge ports 53 are opened on the side surface of the annular groove 43 which is a recess near the center of the first diffusion space 39, but the side surfaces of the annular groove 43 near the peripheral portion of the first diffusion space 39 forms the inclined surface 44 which descends toward the peripheral portion. Therefore, the gas discharged from the third gas discharge ports 53 is prevented from remaining in the annular groove 43, and the TiN film which has a film thickness with high uniformity in the plane of the wafer W can be more reliably formed.

Meanwhile, when the wafer W is heated to a relatively high temperature selected from 400 to 700 degrees C. and is processed at the selected temperature, in order to increase in-plane uniformity of the film thickness of the wafer W and to enhance coverage of the TiN film in every portion in the plane of the wafer W, it is preferable to relatively increase the supply flow rate of the raw material gas. As described above, even if the raw material gas is supplied at a relatively large flow rate, since the gas storage tanks 82B and 82E are installed, the raw material gas can be purged within a short time by supplying a relatively large flow rate of purge gas to the gas supply path forming part 3. As described above, when each gas is supplied to the first diffusion space 39 at a relatively large flow rate, if the flow of the gas in the first diffusion space 39 is impeded, it is considered that a difference in the concentration distribution of the gas is likely to be formed in respective portions in the plane of the wafer. However, as also described in an evaluation test to be described later, according to the configuration of the film forming apparatus 1, it is possible to prevent the gas from remaining in the first diffusion space 39 and to perform the processing in the plane of the wafer W with high uniformity. However, even when the gas is supplied without passing through the respective gas storage tanks, by supplying the gas using the upper shower head 42, it is possible to prevent the gas from remaining in the first diffusion space 39 and to perform the processing in the plane of the wafer W with high uniformity. That is, it may be configured so that each gas storage tank is not installed in the film forming apparatus 1.

Furthermore, since the first connection flow paths 71 extending from the third diffusion space 65 are connected to the peripheral portion of the second diffusion space 52 in the oblique direction, lengths of the gas flow paths from the point P1, at which the first dedicated flow path 61 and the second dedicated flow path 62 merge, to the second diffusion space 52 are equal to each other. With this configuration, each gas is supplied to every portion of the second diffusion space 52 in the circumferential direction with high uniformity of concentration, such that it is possible to more reliably perform the processing of every portion on the periphery of the wafer W with high uniformity. Furthermore, since the second connection flow path 72 is branched off from the first connection flow path 71 and extends in the oblique direction, a length of the flow path from the point P1 to the point P2 of the peripheral portion of the second diffusion space 52 and a length of the flow path from the point P1 to the point P3 near the center of the second diffusion space 52 are equal to each other. With this configuration, the gas is supplied to the central portion and the peripheral portion of the second diffusion space 52 with high uniformity, such that it is possible to more reliably perform the processing with high uniformity between the central portion and the peripheral portion of the wafer W.

Meanwhile, in the aforementioned embodiment, the annular groove 43 may be configured so as not to be formed in the lower surface of the ceiling portion 49. Instead, the lower surface may be a flat surface, and the second gas discharge ports 51 and the third gas discharge ports 53 may be configured to be opened on the flat ceiling surface. However, it is preferable to provide the annular groove 43, because the gas concentration in each portion of the first diffusion space 39 can be more reliably aligned by forming the annular groove 43 to guide the flow of the gas discharged from the third gas discharge ports 53.

The inclined surface 44 of the annular groove 43 is not limited to a straight line as viewed in the longitudinal cross section, but may be a curved line. Furthermore, the annular groove 43 may be configured to guide the gas discharged from the third gas discharge ports 53, and therefore, may be divided in the circumferential direction. That is, recesses may be formed at intervals in the circumferential direction. In each recess, the third gas discharge ports 53 may be opened on the side surface on the central side of the first diffusion space 39, and the side surface on the peripheral side of the first diffusion space 39 may be configured to form an inclined surface. However, the annular groove 43 is formed as the recess in which the third gas discharge ports 53 are opened, such that the discharged gas flows in the radial direction in the annular groove 43. Thus, it is preferable to form the annular groove 43, because the gas uniformity in the radial direction in the first diffusion space 39 can be further enhanced. Furthermore, in the aforementioned example, the upstream side of the third gas discharge ports 53 is connected to the side portion of the second diffusion space 52, but may be connected to the lower side of the second diffusion space 52.

Although the film forming apparatus that performs ALD has been described as an embodiment, the present disclosure may also be applied to a film forming apparatus that performs CVD, and even in this case, a film forming process may be performed by supplying a processing gas to every portion in the plane of the wafer W with high uniformity. In addition, the kind of gas to be used is not limited to the aforementioned examples. Furthermore, the apparatus of the present disclosure is not limited to being applied to the film forming apparatus, but may also be applied to an etching apparatus that performs etching by supplying a processing gas to a wafer W. It should be understood that the embodiments disclosed herein are illustrative in every respect and are not intended to be restrictive. The aforementioned embodiments may be omitted, substituted, or changed in various forms without departing from the spirit and scope of the appended claims.

Evaluation Test

Next, an evaluation test conducted with reference to the film forming apparatus 1 will be described. In evaluation test 1, a film forming process was performed on a wafer W using the film forming apparatus 1, and distribution of film thickness in each portion in the plane of the wafer W was examined. Then, an average value of film thickness as formed and a range of the film thickness (maximum value of film thickness minus minimum value of film thickness) were calculated. In comparative test 1, a test was conducted using a film forming apparatus for testing, similar to using the film forming apparatus 1. A difference between the film forming apparatus for testing and the film forming apparatus 1 will be described. In the film forming apparatus for testing, the annular groove 43 is not formed on the ceiling surface defining the first diffusion space 39, and a circular gas discharge part is installed to protrude downward from the ceiling surface. A plurality of gas discharge parts is installed at intervals along the circumferential direction of the first diffusion space 39. Furthermore, a plurality of gas discharge ports is opened at intervals along the circumferential direction of the gas discharge part on a side surface of the gas discharge part. The gas discharge ports of the gas discharge part are horizontally opened, and the gas discharge part radially discharges a gas in a plan view.

Figure 12:
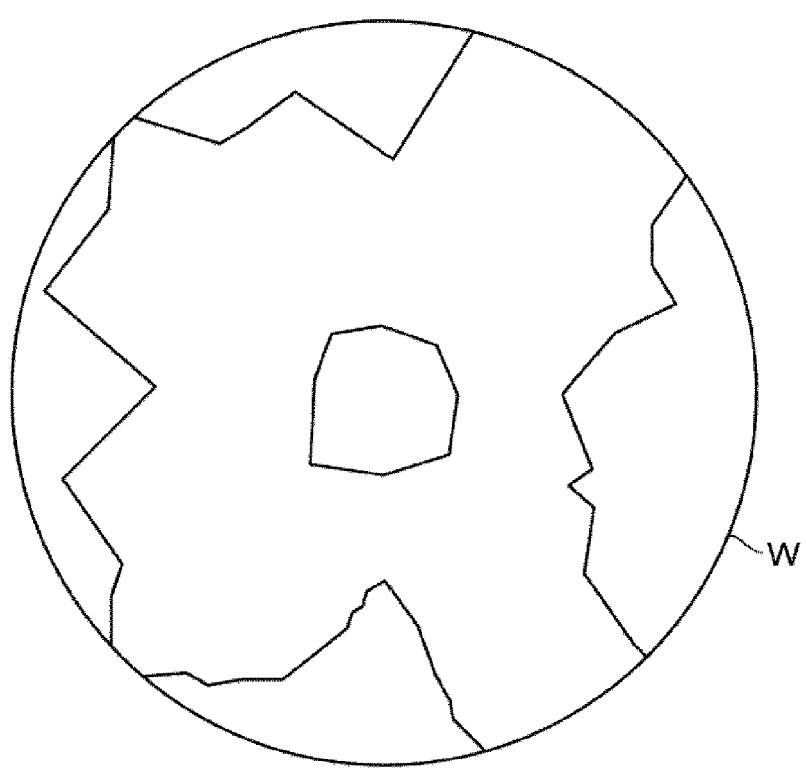
FIG. 12 is a plan view of a wafer illustrating results of an evaluation test.
Figure 13:
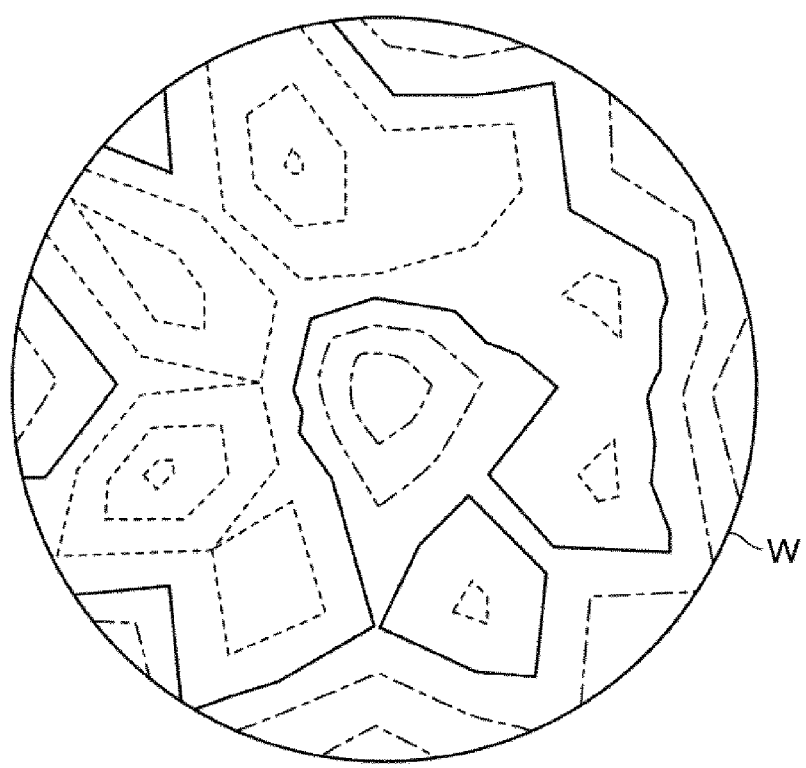
FIG. 13 is a plan view of a wafer illustrating results of an evaluation test.

FIG. 12 is a plan view of a wafer W illustrating results of evaluation test 1, and FIG. 13 is a plan view of a wafer W illustrating results of comparative test 1. In FIGS. 12 and 13, a film thickness distribution in the plane of the wafer W is indicated by contour lines. In FIG. 13, points at which a predetermined film thickness is obtained are indicated by solid lines, dotted lines, and chain lines, respectively, and film thicknesses on these lines are different from each other. In comparative test 1, a region surrounded by dotted lines appeared to correspond to the position of the gas discharge part. This is considered to be due to the fact that a gas is hard to flow in the lower region of the gas discharge part in the first diffusion space 39 than in other regions. In evaluation test 1, since a region which becomes a film thickness indicated by dotted lines and chain lines does not appear, only the contour lines of solid lines are indicated. This is considered to be due to the fact that a gas is prevented from remaining in the first diffusion space 39, and the gas smoothly flows in the first diffusion space 39. In evaluation test 1, an average value of film thickness was 95.1 Å and a range of film thickness was 1.4 Å, whereas, in comparative test 1, an average value of film thickness was 99.7 Å and a range of film thickness was 6.3 Å. As described above, there is no substantial difference in the average value of film thickness, but the range of film thickness for evaluation test 1 is smaller than that of the comparative test 1. Accordingly, it was confirmed from the results of evaluation test 1 that the uniformity of film thickness distribution on the wafer W can be enhanced by performing the processing using the film forming apparatus 1.

According to the present disclosure in some embodiments, it is possible to perform gas processing with high uniformity in the plane of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas processing apparatus, comprising:
   a vacuum vessel configured to form a vacuum atmosphere in the vacuum vessel;
   a mounting part installed in the vacuum vessel and configured to mount a substrate;
   an opposing part configured to face the mounting part and including first gas discharge ports configured to discharge a processing gas in a shower shape to the substrate to perform a gas processing;
   a ceiling portion disposed above the opposing part and including a shower head, an annular groove surrounding the shower head and partially defined by an inclined surface, and an opposing surface extending from an outer edge of the inclined surface;
   a first diffusion space of the processing gas formed between the opposing part and the ceiling portion, and configured to communicate with the first gas discharge ports;
   second gas discharge ports formed vertically in the shower head and configured to supply the processing gas in a shower shape to a central portion of the first diffusion space;
   a second diffusion space of the processing gas formed above the ceiling portion and configured to communicate with the second gas discharge ports;
   a gas supply path installed at an upstream side of the second diffusion space and configured to supply the processing gas to the second diffusion space; and
   third gas discharge ports formed in the shower head, each of the third gas discharge ports configured to:
      extend from the second diffusion space to be opened to the annular groove in an oblique direction having a larger slope with respect to a vertical axis than a slope of the second gas discharge ports with respect to the vertical axis,
      communicate with the second diffusion space in a row along a circumference of the first diffusion space, and
      radially discharge the processing gas from a central side of the first diffusion space to a peripheral side of the first diffusion space.

2. The apparatus of claim 1, wherein
   the third gas discharge ports are opened on a side surface of the annular groove which is close to the central portion of the first diffusion space, and
   a side surface of the annular groove which is close to a peripheral portion of the first diffusion space forms an inclined surface which descends downward from the central portion of the first diffusion space to the peripheral portion of the first diffusion space.

3. The apparatus of claim 2, wherein the annular groove surrounds the shower head,
   the third gas discharge ports are opened to an inner side surface of the annular groove, and
   the inclined surface is an outer side surface of the annular groove.

4. The apparatus of claim 1, wherein a region in which the first gas discharge ports are distributed in the opposing part is larger than a region in which the second gas discharge ports are distributed and is larger than a region in which the third gas discharge ports are distributed.

5. The apparatus of claim 1, wherein the gas supply path includes inclined flow paths connected to the second diffusion space in an oblique direction.

6. The apparatus of claim 5, wherein each of the inclined flow paths includes:
   a first connection flow path formed to extend from a central portion of the second diffusion space to a peripheral portion of the second diffusion space in a plan view, and connected to the second diffusion space; and
   a second connection flow path branched off from the first connection flow path, formed to extend from the peripheral portion of the second diffusion space to the central portion of the second diffusion space in a plan view, and connected to a position in the second diffusion space closer to the central portion of the second diffusion space than a position at which the first connection flow path is connected in the second diffusion space.

7. The apparatus of claim 1, wherein the processing gas includes a first processing gas and a second processing gas, and
   the gas supply path includes:
   a first dedicated flow path configured to supply only the first processing gas between the first processing gas and the second processing gas;

a second dedicated flow path configured to supply only the second processing gas between the first processing gas and the second processing gas;

a merged flow path formed by merging a downstream side of the first dedicated flow path and a downstream side of the second dedicated flow path; and a branch path formed by branching a downstream side of the merged flow path into a plurality of branches, through which the first and second processing gases are introduced to the second diffusion space.

8. A gas processing method, comprising:

forming a vacuum atmosphere in a vacuum vessel;

mounting a substrate on a mounting part installed in the vacuum vessel;

discharging a processing gas to the substrate in a shower shape from first gas discharge ports installed in an opposing part configured to face the mounting part to perform a gas processing;

supplying the processing gas to a first diffusion space of the processing gas, the first diffusion space formed between the opposing part and a ceiling portion and configured to communicate with the first gas discharge ports, the ceiling portion being disposed above the opposing part and including a shower head, and annular groove surrounding the shower head and partially defined by an inclined surface, and an opposing surface extending from an outer edge of the inclined surface;

supplying the processing gas in a shower shape to a central portion of the first diffusion space from second gas discharge ports formed vertically in the shower head;

supplying the processing gas to a second diffusion space of the processing gas from a gas supply path installed at an upstream side of the second diffusion space, the second diffusion space being formed above the ceiling portion and configured to communicate with the second gas discharge ports; and radially discharging the processing gas from third gas discharge ports formed in the shower head from a central side of the first diffusion space to a peripheral side of the first diffusion space, each of the third gas discharge ports extending from the second diffusion space to be opened to the annular groove in an oblique direction having a larger slope with respect to a vertical axis than a slope of the second gas discharge ports with respect to the vertical axis, and communicating with the second diffusion space in a row along a circumference of the first diffusion space.

* * * * *